United States Patent
Domenicucci et al.

(10) Patent No.: US 8,490,029 B2
(45) Date of Patent: Jul. 16, 2013

(54) METHOD OF FABRICATING A DEVICE USING LOW TEMPERATURE ANNEAL PROCESSES, A DEVICE AND DESIGN STRUCTURE

(75) Inventors: Anthony G. Domenicucci, New Paltz, NY (US); Terence L. Kane, Wappinger Falls, NY (US); Shreesh Narasimha, Beacon, NY (US); Karen A. Nummy, Hopewell Junction, NY (US); Viorel Ontalus, Hopewell Junction, NY (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/421,400

(22) Filed: Mar. 15, 2012

(65) Prior Publication Data

US 2012/0180010 A1 Jul. 12, 2012

Related U.S. Application Data

(62) Division of application No. 12/511,535, filed on Jul. 29, 2009, now Pat. No. 8,236,709.

(51) Int. Cl.
*G06F 17/50* (2006.01)

(52) U.S. Cl.
USPC ............... 716/51; 716/54; 716/106; 716/110; 716/111; 716/136; 438/530; 438/540; 438/550; 438/791; 438/799

(58) Field of Classification Search
USPC ............ 716/50–56, 106, 110–112, 132–136; 438/530, 540, 550, 791, 799
See application file for complete search history.

(56) References Cited

U.S. PATENT DOCUMENTS

| | | | |
|---|---|---|---|
| 4,777,517 A | 10/1988 | Onodera et al. | |
| 5,702,986 A | 12/1997 | Mathews et al. | |
| 5,714,413 A | 2/1998 | Brigham et al. | |
| 6,924,181 B2 | 8/2005 | Huang et al. | |

(Continued)

FOREIGN PATENT DOCUMENTS

| | | |
|---|---|---|
| CN | 101075563 A | 11/2007 |
| JP | 62210618 A | 9/1987 |
| WO | WO2009018556 A2 | 2/2009 |

OTHER PUBLICATIONS

Notice of Allowance for U.S. Appl. No. 12/511,535, dated Apr. 3, 2012.

(Continued)

*Primary Examiner* — Paul Dinh
(74) *Attorney, Agent, or Firm* — Matthew C Zehrer; Roberts Mlotkowski Safran & Cole, P.C.

(57) ABSTRACT

A method of fabricating a device using a sequence of annealing processes is provided. More particularly, a logic NFET device fabricated using a low temperature anneal to eliminate dislocation defects, method of fabricating the NFET device and design structure is shown and described. The method includes forming a stress liner over a gate structure and subjecting the gate structure and stress liner to a low temperature anneal process to form a stacking force in single crystalline silicon near the gate structure as a way to memorized the stress effort. The method further includes stripping the stress liner from the gate structure and performing an activation anneal at high temperature on device.

11 Claims, 6 Drawing Sheets

U.S. PATENT DOCUMENTS

| | | | |
|---|---|---|---|
| 7,193,254 | B2 | 3/2007 | Chan et al. |
| 7,265,066 | B2 | 9/2007 | Masonobu et al. |
| 7,300,891 | B2 | 11/2007 | Masonobu et al. |
| 7,381,623 | B1 | 6/2008 | Chen et al. |
| 7,442,611 | B2 | 10/2008 | Chan et al. |
| 7,504,336 | B2 | 3/2009 | Purtell et al. |
| 7,504,704 | B2 | 3/2009 | Currie et al. |
| 7,514,317 | B2 | 4/2009 | Lindsay |
| 7,547,596 | B2 | 6/2009 | Visokay et al. |
| 7,687,829 | B2 | 3/2010 | Chidambarrao et al. |
| 7,704,823 | B2 | 4/2010 | Lindsay |
| 7,759,207 | B2 | 7/2010 | Quek et al. |
| 7,763,505 | B2 | 7/2010 | Gehring et al. |
| 7,767,534 | B2 | 8/2010 | Yang et al. |
| 7,888,197 | B2 | 2/2011 | Chidambarrao et al. |
| 7,932,542 | B2 | 4/2011 | Berthold |
| 7,952,122 | B2 | 5/2011 | Lindsay |
| 7,964,894 | B2 | 6/2011 | Quek et al. |
| 8,058,157 | B2 | 11/2011 | Zhu et al. |
| 8,076,209 | B2 | 12/2011 | Yang et al. |
| 8,084,312 | B2 | 12/2011 | Chakravarthi et al. |
| 2003/0181005 | A1 | 9/2003 | Hachimine et al. |
| 2004/0029323 | A1 | 2/2004 | Shimizu et al. |
| 2004/0075148 | A1 | 4/2004 | Kumagai et al. |
| 2004/0142545 | A1 | 7/2004 | Ngo et al. |
| 2006/0226518 | A1 | 10/2006 | Masanobu et al. |
| 2006/0226519 | A1 | 10/2006 | Masonobu et al. |
| 2007/0158743 | A1 | 7/2007 | Chang et al. |
| 2007/0190741 | A1 | 8/2007 | Lindsay |
| 2008/0057665 | A1 | 3/2008 | Lindsay |
| 2008/0081403 | A1 | 4/2008 | Gehring et al. |
| 2008/0283926 | A1 | 11/2008 | Sridhar |
| 2009/0032877 | A1 | 2/2009 | Visokay et al. |
| 2009/0224321 | A1 | 9/2009 | Tsuchiya |
| 2009/0242944 | A1 | 10/2009 | Zhang et al. |
| 2009/0289284 | A1 | 11/2009 | Goh et al. |
| 2010/0081245 | A1 | 4/2010 | Yang et al. |
| 2010/0140722 | A1 | 6/2010 | Lindsay |
| 2010/0224937 | A1 | 9/2010 | Sridhar |
| 2011/0027956 | A1 | 2/2011 | Domenicucci et al. |
| 2011/0114996 | A1 | 5/2011 | Florenza et al. |
| 2011/0117724 | A1 * | 5/2011 | Ko et al. .................. 438/431 |
| 2011/0183487 | A1 | 7/2011 | Lindsay |

OTHER PUBLICATIONS

Wei et al. "Multiple Stress Memorization in Advanced SOI CMOS Technologies", 2007 Symposium on VLSI Technology Digest of Technical Papers, p. 216-217.

\* cited by examiner

METHOD OF FABRICATING A DEVICE USING LOW TEMPERATURE ANNEAL PROCESSES, A DEVICE AND DESIGN STRUCTURE

CROSS REFERENCE TO RELATED APPLICATIONS

The present application is a divisional application of co-pending U.S. application Ser. No. 12/511,535, filed on Jul. 29, 2009, the contents of which are incorporated by reference in its entirety herein.

FIELD OF THE INVENTION

The invention relates to a method of fabricating a device using a sequence of annealing processes, and more particularly, to a logic NFET device fabricated using a sequence of annealing processes to eliminate dislocation defects, method of fabricating the NFET device and design structure, with enhanced device performance.

BACKGROUND

Mechanical strains within a semiconductor device substrate can modulate device performance by, for example, increasing the mobility of the carriers in the semiconductor device. That is, strains within a semiconductor device are known to enhance semiconductor device characteristics. Thus, to improve the characteristics of a semiconductor device, tensile and/or compressive strains are created in the channel of the n-type devices (e.g., NFETs) and/or p-type devices (e.g., PFETs), respectively.

However, the same strain component, for example, tensile strain or compressive strain in a certain direction, may improve the device characteristics of one type of device (i.e., n-type device or p-type device) while discriminatively affecting the characteristics of the other type device. Accordingly, in order to maximize the performance of both NFETs and PFETs within integrated circuit (IC) devices, the strain components should be engineered and applied differently for NFETs and PFETs.

Distinctive processes and different combinations of materials are used to selectively create a strain in a FET. For example, stress memorization techniques (SMT) have been developed to enhance device performance. In SMT, a stress liner encapsulates the NFET device which is then subjected to a high temperature anneal. The high temperature anneal can be upwards of 1100° C. The combination of the amorphizing extension ion implant, a high temperature anneal and stress liner creates stacking fault type defects in the Si of NFET device, near the gate. After anneal, the stress nitride liner is removed by the chemical etch, however, the effect of the stress remains within the NFET device. This effect is known as a stress memorization technique (SMT).

Because the stacking fault can act as a dislocation nucleation site under the influence of high stress and high temperature process conditions, dislocations are prone to appear, mainly on high mobility NFETs. The dislocation defects have been found to coincide with the placement of the stress film on the logic side of the device. This dislocation starts at the end of one stacking fault and, under the influence of high temperature (of about 1100° C.) and stress, moves on a [100] plane towards the gate electrode. It is found that the dislocations end either at the surface of the Si (side wall of Si) or at another stacking fault.

Stacking faults have either an extra plane or a missing plane in 111 stacking direction. The depth and density of stacking faults can vary depending with the process condition. Normally, the more stress during the re-crystallization process, the higher the density of stacking faults generated along the gate. Stacking faults can end in a partial dislocation in single crystal Si or at a Si surface. The partial dislocation are relative immobile; however, as motioned above, the end of fault can act as a source of dislocations under right process conditions, i.e., high temperature and high stress.

Dislocation defects in an otherwise perfect, monolithic crystal structure introduce unwanted and abrupt changes in electrical and optical properties. When a dislocation crosses a junction, it can causes a junction leakage. Dislocation defects are shown in the device of FIG. 1a and FIG. 1b. The dislocation defects can thus impair device performance, e.g., cause high device leakage. In fact, it has been found that leakage can be in the range of about 10-40 µA for an NFET device.

Accordingly, there exists a need in the art to overcome the deficiencies and limitations described hereinabove for high performance devices.

SUMMARY

In an aspect of the invention, a method of manufacturing a device comprises forming a stress liner over a gate structure and subjecting the gate structure and stress liner to a low temperature anneal process to form a stacking force. The method further comprises stripping the stress liner from the gate structure and performing an activation anneal on the gate structure.

In an aspect of the invention, a method of manufacturing a logic NFET comprises forming a gate structure on a wafer and depositing a stress material over the gate structure. The method further comprises subjecting the gate structure and stress liner to a low temperature anneal process at a first temperature and stripping the stress liner from the gate structure. The method further comprises performing an activation anneal at a second temperature higher than the first temperature.

In an aspect of the invention, a method of forming an NFET device comprises: forming a gate structure on a wafer; depositing a stress material on the gate structure and portions of the wafer; subjecting the stress material, gate structure and wafer to a low temperature anneal in a range of about 550° C. to about 650° C. to form a stacking fault under the gate structure; stripping the stress material from the gate structure and the portions of the wafer; and subjecting the gate structure and wafer to an activation anneal, which is at a temperature higher than the low temperature anneal.

In another aspect of the invention, a design structure embodied in a machine readable medium for designing, manufacturing, or testing an integrated circuit is provided. The design structure comprises the structures and/or methods of the present invention. Additionally, a method in a computer-aided design system is provided for generating a functional design model of a logic NFET device, comprising the steps described herein.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a method of fabricating a device using a sequence of annealing processes, and more particularly, to a logic NFET device fabricated using a sequence of annealing processes to eliminate dislocation defects, method of fabricating the NFET device and design structure. In implementation, the present invention uses stress memorization techniques (SMT) with an annealing process to create a stress effect under the NFET device while eliminating dislocation defects.

More specifically, in logic device process development, SMT has been found to enhance device performance. For example, it has been found that SMT can provide about 5% to 10% ion improvement for NFET devices, for example, by amorphizing the source/drain extension region of the NFET device. The conventional SMT uses a disposable stress liner to encapsulate NFET and a high temperature anneal process to provide a stress component for the NFET device. However, the high temperature anneal also results in dislocation defects, which can render the device inoperable.

It has been discovered that the strain to the channel, which enhances device performance, which is due to plastic deformation which results in stacking faults at the gate edge, can be generated at low re-crystallization temperatures (lower annealing temperature) with the stress nitride film in place, without the formation of dislocations moving along [100] plane at high annealing temperature with high stress nitride film. In order to manufacturing high performance device, it is desirable to have the stacking faults to increase strain onto the channel of device to enhance the device performance (increase the drive current of device), but at the same time we want to remove dislocation defect which causes failure of the device.

In the present invention, though, after the stress liner is deposited on the structure, a low temperature anneal process is performed, e.g., in the range of about 550° C. to 650° C. to recrystallize the NFET region. This low temperature anneal creates a stress component (stacking fault) under the NFET device. Unlike a high temperature anneal processes, though, the low temperature anneal process will not create dislocation defects.

In the embodiments, after the low temperature anneal process, the stress film is removed and a high temperature activation anneal is performed on the NFET device. The high temperature activation anneal is higher than the low temperature anneal process and is in the range, e.g., 900° C. to 1100° C. Advantageously, as the stress film is removed prior to the high temperature activation anneal, the device is "stress free" during the high temperature anneal process and, as such, dislocation defects will not form under the gate of the NFET device. This will ensure proper device performance.

Figure 1A:
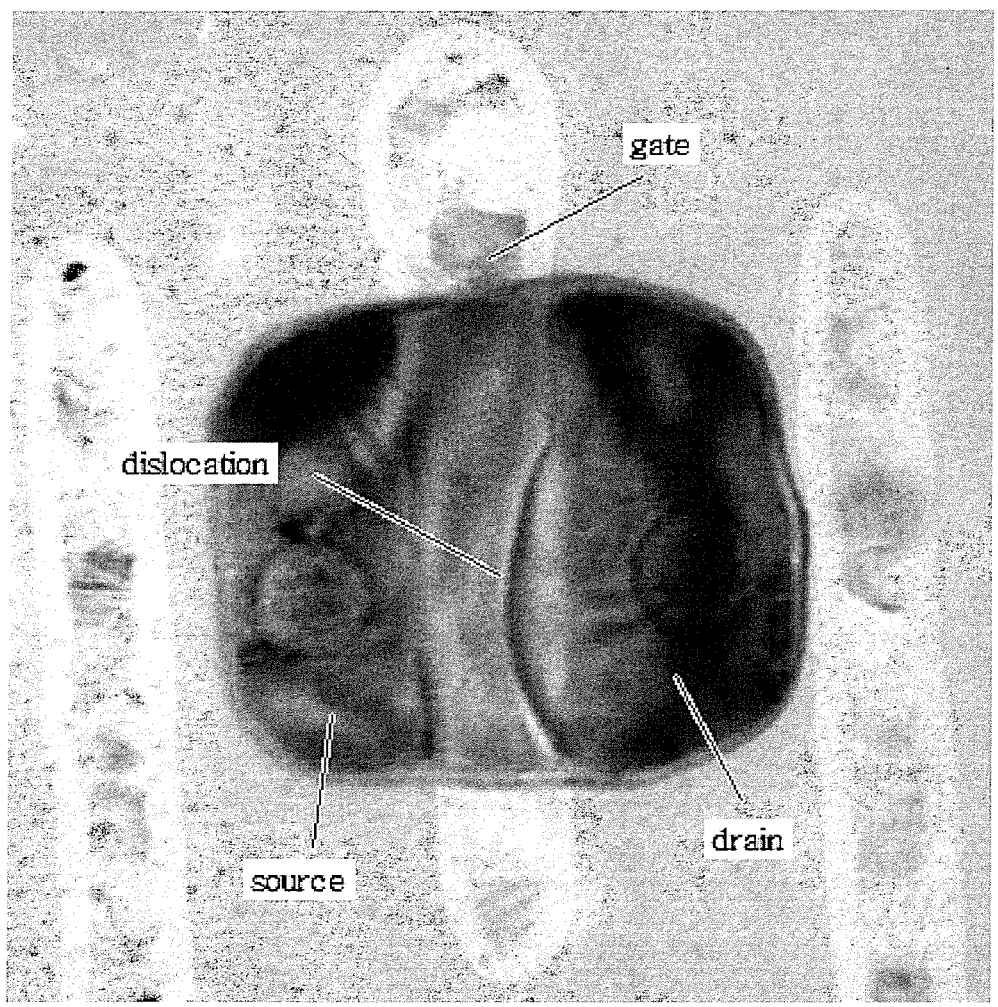
FIGS. 1a and 1b show a logic NFET structure with dislocation defects under the gate.
Figure 1B:
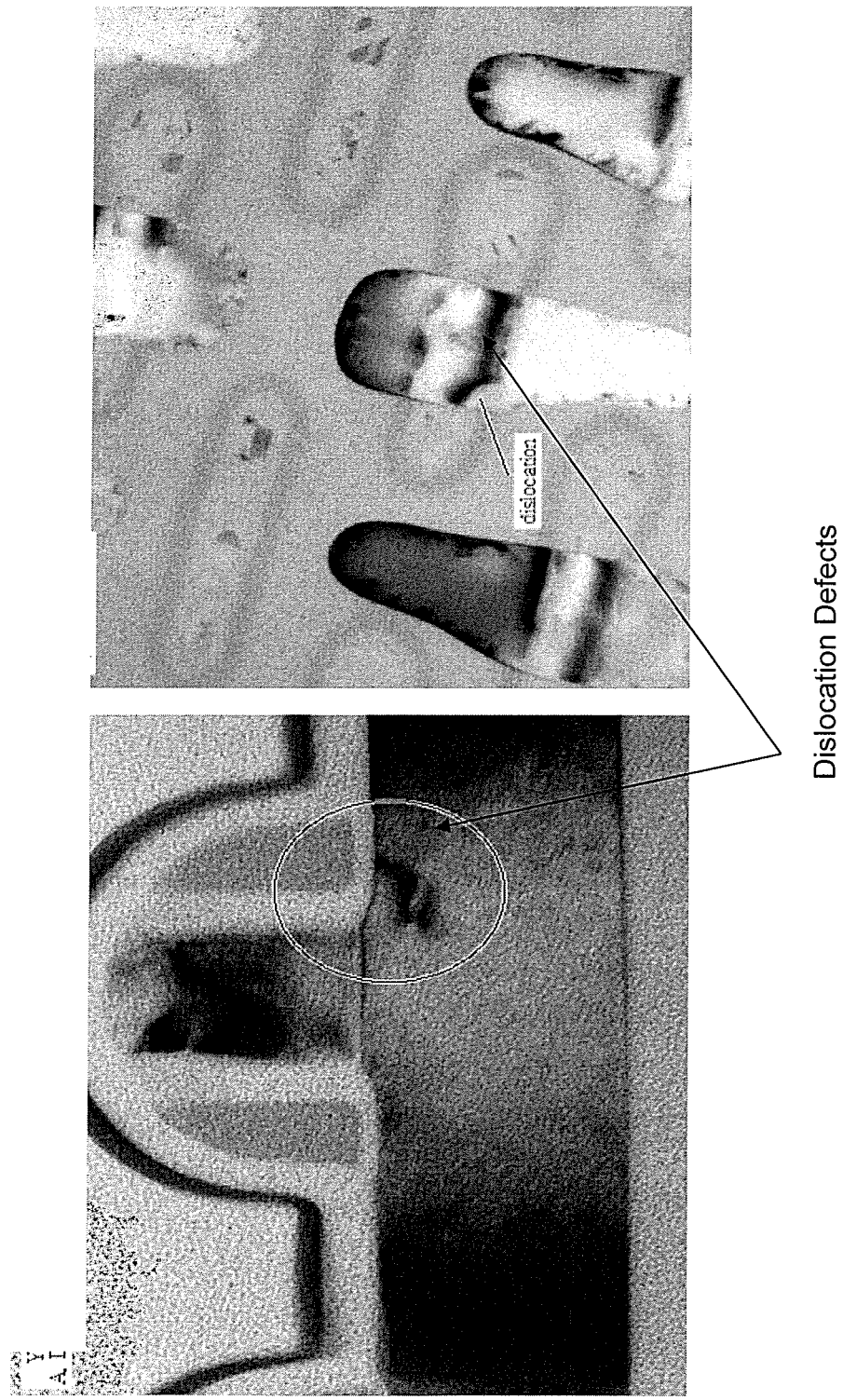
Figure 2:
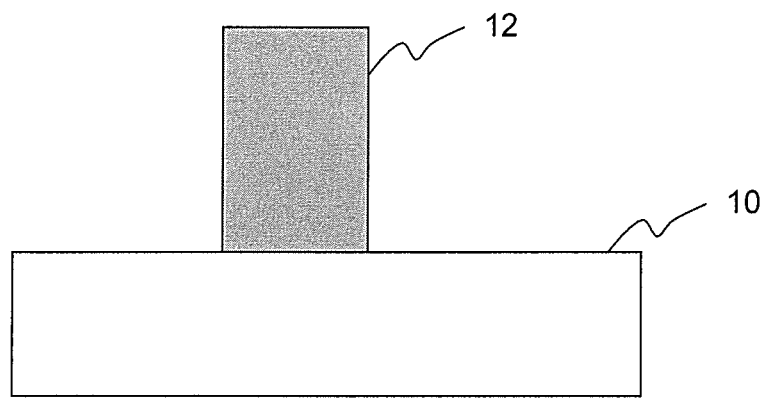
FIGS. 2-5 show structures and respective processing steps in accordance with an aspect of the invention.

FIGS. 2-5 show structures and respective processing steps in accordance with an aspect of the invention. More specifically, FIG. 2 shows a starting structure comprising a wafer 10 having a poly gate structure 12 formed on the top side thereof. In embodiments, the wafer 10 can be silicon, non-crystalline BULK materials or silicon on insulator (SOI), to name a few material types.

In embodiments, the poly gate structure 12 is formed using conventional photolithographic processes, well known to those of skill in the art. By way of a non-limiting illustration, the poly gate structure 12 can be formed by depositing a poly material on the wafer 10 using conventional deposition processes such as, for example, chemical vapor deposition (CVD), physical vapor deposition (PVD), atomic layer deposition (ALD), etc. A resist is deposited on the poly material, with selective portions of the resist being exposed to form openings. In subsequent processes, the exposed poly material is etched away using a conventional process such as, for example, reactive ion etching (RIE). The remaining resist can be stripped away using wet or dry methods, such as downstream oxygen plasma processes.

Figure 3:
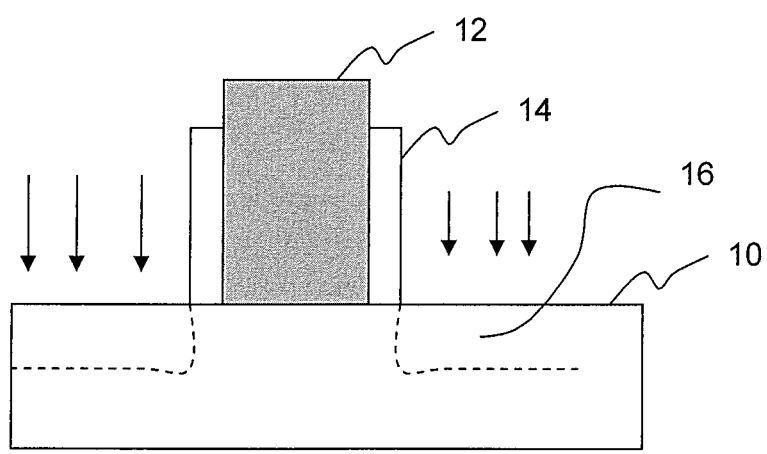

As shown in FIG. 3, sidewalls 14 are formed on the poly gate structure 12. The sidewalls 14 are formed using conventional deposition and etching processes such that further explanation is not required herein in order to understand the invention. The sidewalls can be formed from an oxide material such as, for example, SiOx. The sidewalls 14 can have a thickness of about 5 nm to about 10 nm; although, other dimensions are also contemplated by the present invention. As such, the thickness of about 5 nm to about 10 nm should not be considered a limiting feature of the present invention.

FIG. 3 further shows an extension implant process in accordance with aspects of the invention. The extension implant (as represented by the arrows in FIG. 3) can be, for example, known species provided at known energy and dose levels. For example, the extension implants can be, for example, As, P, additional amorphizing species: Xe, Ge, provided at known energies, doses and angles such that further explanation is not required herein for those of skill in the art to understand the invention. The extension implants will result in an amorphized region 16 on the side of the gate structure 12. As should be understood by those of skill in the art, the use of the sidewalls 14 results in the amorphized region 16 being spaced formed slightly away from the main body (poly) of the gate structure 12.

Figure 4:
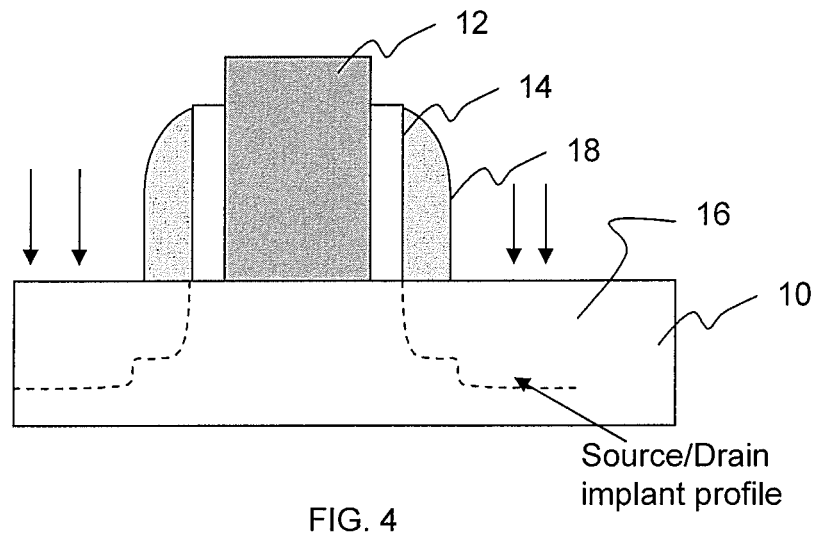

FIG. 4 shows further processing steps in accordance with the invention. In particular, FIG. 4 shows the formation of a spacer 18 adjacent to the sidewalls 14 and above the amorphized region 16. The spacer 18 can be SiN, for example. The spacer 18 can be formed in a conventional manner such as, for example, conventional deposition (CVD) and etching (RIE) techniques. In embodiments, the spacer can be about 400 Å in thickness; although, the present invention should not be limited to such dimension. In embodiments, the spacer 18 can be formed over an optional oxide layer, deposited on the wafer 10. Those of skill in the art should understand that the spacer 18 can isolate the gate contact and source and drain contacts, as well as also passivates the sidewalls of the gate stack.

FIG. 4 further shows the formation of source and drain regions. The source/drain regions are formed by conventional implantation processes such as, for example, using conventionally known species (e.g., As and P) at conventional energies and doses.

Figure 5:
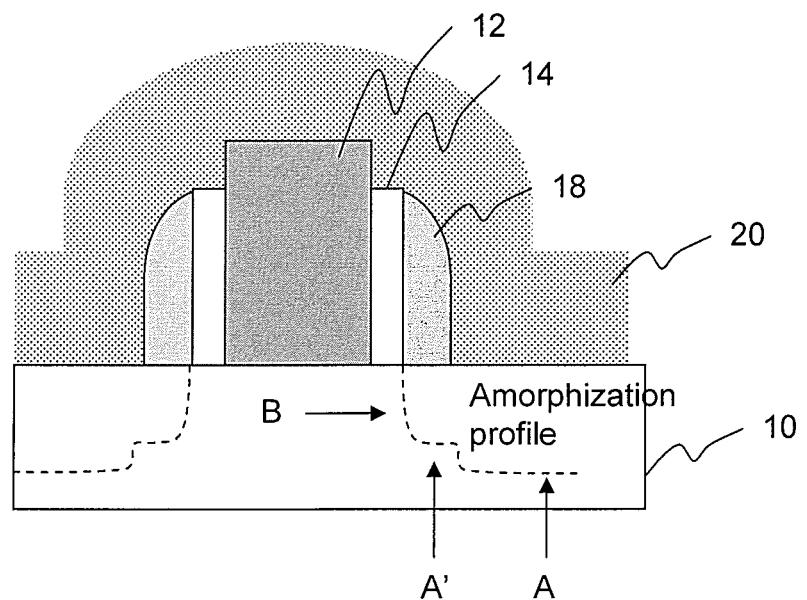

As shown in FIG. 5, a stress material (liner) 20 is formed over the structure of FIG. 4. Specifically, the stress material 20 can be formed, for example, using a conventional deposition process, similar to that used in SMT. The stress material 20 can be, for example, SiN, deposited to a thickness of about 5 nm to about 15 nm, but can be upwards of about 500 Å. After the deposition of the stress material 20, the structure undergoes a low temperature anneal process (represented by the several vertical arrows above the structure) in order to create a stacking force under the structure (e.g., near the gate). The low temperature anneal is performed at below about 650° C., and more preferably between about 550° C. to about 650° C. (The low temperature anneal is lower than an activation anneal.)

The low temperature anneal process in combination with the stress material 20, will create the stacking force. It has been found that the low temperature anneal is capable of controlling the formation of the stacking force such that dislocation defects do not form under the gate structure 12.

More specifically, in embodiments, the low temperature anneal process recrystallizes the amorphized region 16 to from the stacking force, e.g., a stress component in the wafer 10. The recrystallization of the amorphized region 16 is represented by a combination of re-crystallization surface from vertical surface and horizontal surface shown schematically by arrows "A" or "A" and "B", respectively, which meet to form the stacking force. In embodiments, the stacking force is parallel to the gate structure 12. Due to the superior control of the stacking force using the low temperature anneal, dislocation defects will not form under the gate structure thus ensuring a dislocation free device with enhanced performance.

Initially, it was thought that the re-crystallization anneal and activation anneal has to be in the same annealing process in order to obtain the benefit of the stress memorization effect. However, it now realized that re-crystallization process at low temperature is sufficient enough to create the stacking fault, which adds strain onto the channel, and the dopant activation temperature can be separated from the re-crystallization annealing.

Figure 6:
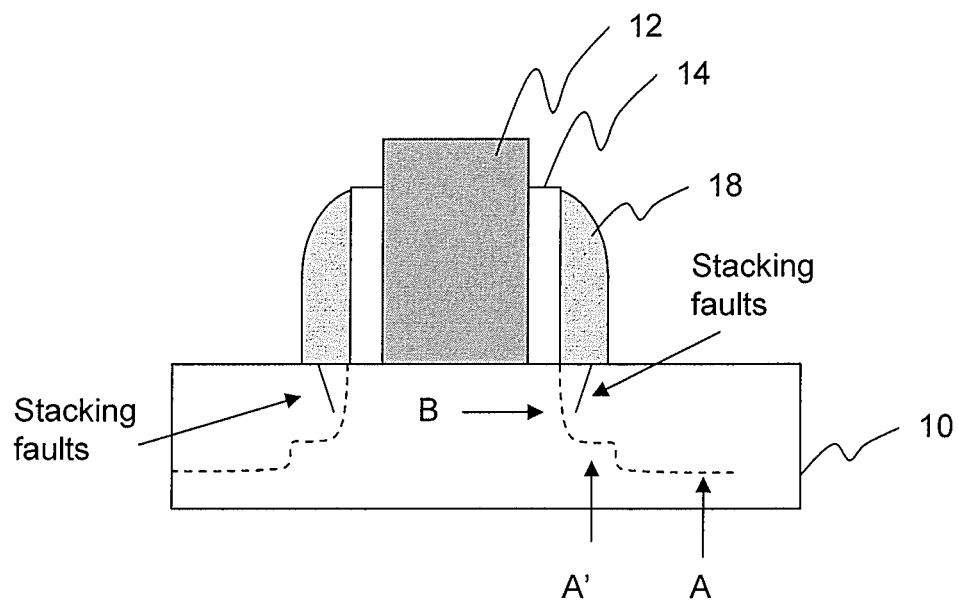
FIG. 6 shows a final logic NFET device and respective processing steps in accordance with an aspect of the invention.

In FIG. 6, the stress material is stripped from the structure of FIG. 5. The stripping process can be a reactive ion etching (RIE), for example. After the stress material is stripped, an activation anneal at a high temperature is performed. The activation anneal (high temperature anneal) is performed at about 900° C. to about 1100° C., and is preferably in the range of about 1065° C. Those of skill in the art should understand that the activation anneal will activate the dopants used in the extension and source drain implant processes.

Figure 7:
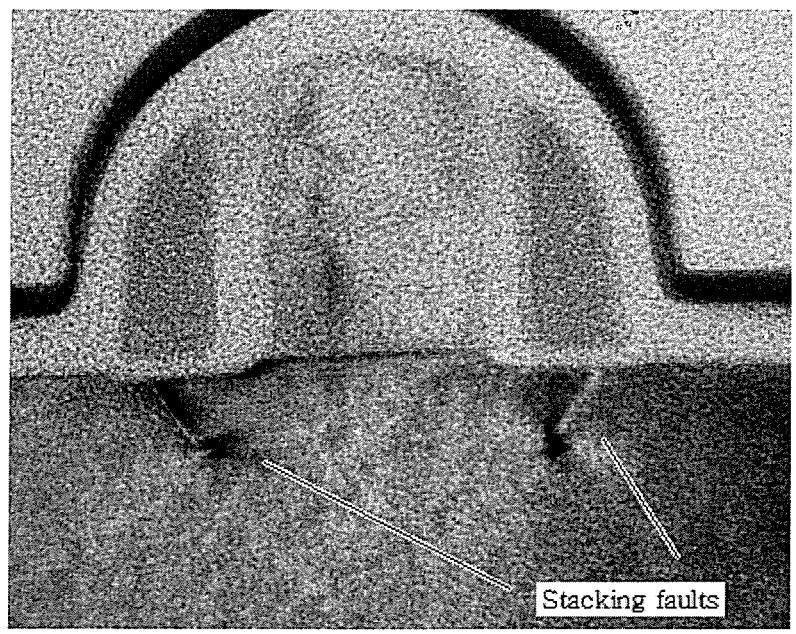
FIG. 7 shows a logic NFET device with a stress component (stacking force) in accordance with an aspect of the invention.

FIG. 7 shows a final structure in accordance with the invention. As seen in FIG. 7, the stacking force is parallel to the gate structure. That is, the stacking force does not extend to underneath the gate, which can cause dislocation defects under the gate, itself.

Design Structure

Figure 8:
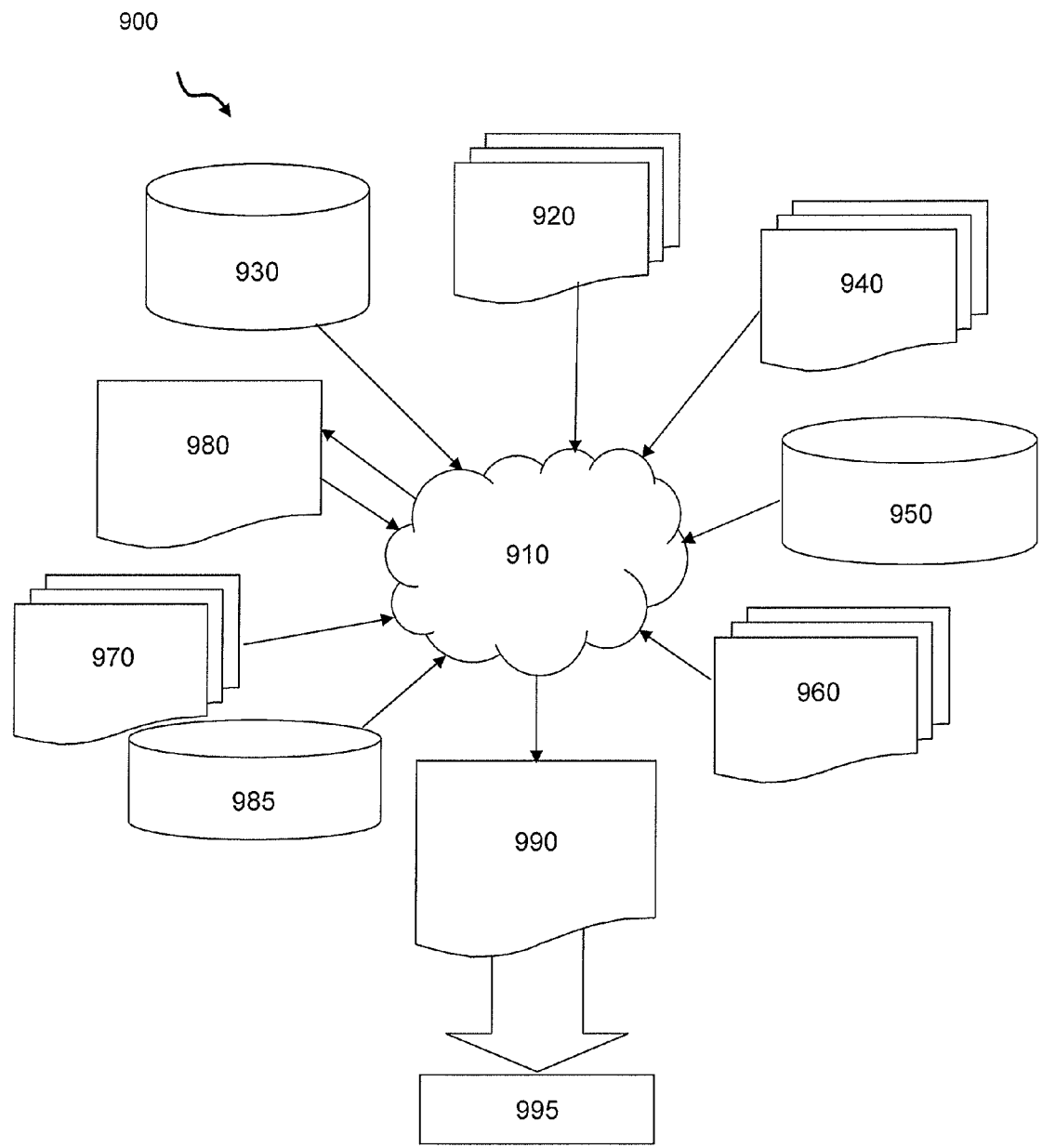
FIG. 8 is a flow diagram of a design process used in semiconductor design, manufacture, and/or test.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-7. In one embodiment, design structure 990 may comprise a compiled, executable HDL simulation model that functionally simulates the devices shown in FIGS. 2-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-7. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method in a computer-aided design system for generating a functional design model of a logic NFET device, the method comprising:
    generating a functional representation of a gate structure on a wafer;
    generating a functional representation of a stress material on the gate structure;
    generating a functional representation of a low temperature anneal process in a range of about 550° C. to about 650° C. on the stress material;
    generating a functional representation of the stress material being stripped from the gate structure; and
    generating a functional representation of the gate structure being subjected to an activation anneal after the stress material is stripped by using the computer-aided design system, wherein the activation anneal is at a temperature higher than the low temperature anneal.

2. The method of claim 1, wherein the functional design model comprises a netlist.

3. The method of claim 1, wherein the functional design model resides on storage medium as a data format used for exchange of layout data of integrated circuits.

4. The method of claim 1, wherein the functional design model resides in a programmable gate array.

5. The method of claim 1, wherein the low temperature anneal process is about below 650° C.

6. The method of claim 1, wherein the stress material is SiN on the gate structure.

7. The method of claim 1, wherein the activation anneal is a high temperature anneal.

8. The method of claim 7, wherein the high temperature anneal is in a range of about 900° C. to about 1100° C.

9. The method of claim 1, wherein the activation anneal is performed at a temperature higher than the low temperature anneal process.

10. The method of claim 1, wherein the functional representation of the gate structure includes a spacer and a sidewall formed over a polysilicon material.

11. The method of claim 1, further comprising generating a functional representation of implanting extension regions and doping source and drain regions in a wafer under a portion of the stress material.

* * * * *